United States Patent [19]

Oikawa et al.

[11] Patent Number: 4,770,948

[45] Date of Patent: * Sep. 13, 1988

[54] HIGH-PURITY METAL AND METAL SILICIDE TARGET FOR LSI ELECTRODES

[75] Inventors: Hideo Oikawa; Takao Amazawa, both of Atsugi; Nakahachiro Honna, Musashino; Hideo Miyazaki; Iwao Kyono, both of Toda; Nobuyuki Mori, Tokyo; Yoshiharu Katoh; Masami Kuroki, both of Toda, all of Japan

[73] Assignees: Nihon Kogyo Kabushiki Kaisha; Nippon Telegraph and Telephone Corporation, both of Tokyo, Japan

[ * ] Notice: The portion of the term of this patent subsequent to Oct. 28, 2003 has been disclaimed.

[21] Appl. No.: 877,559

[22] Filed: Jun. 23, 1986

Related U.S. Application Data

[62] Division of Ser. No. 634,895, Jul. 26, 1984, Pat. No. 4,619,695.

[30] Foreign Application Priority Data

Sep. 22, 1983 [JP] Japan .................. 58-174164

[51] Int. Cl.[4] .................................................. H01L 29/46
[52] U.S. Cl. .................................. 428/664; 428/620; 428/641; 75/0.5 AB; 75/0.5 BB; 75/65 EB; 75/84; 148/423; 357/23.1; 357/67; 357/71; 419/28; 420/429; 420/430

[58] Field of Search ....... 75/0.5 AB, 0.5 AC, 0.5 BB, 75/65 EB, 84; 148/423; 419/28, 54; 420/429, 430; 428/620, 641, 664; 427/99, 124; 204/192.17, 192.25; 357/67, 71

[56] References Cited

U.S. PATENT DOCUMENTS

| | | | |
|---|---|---|---|
| 2,948,609 | 8/1960 | Millner et al. | 419/54 |
| 3,933,474 | 1/1976 | Ham et al. | 75/65 EB |
| 4,430,296 | 2/1984 | Koizumi et al. | 420/429 |
| 4,619,695 | 10/1986 | Oikawa et al. | 75/65 EB |

FOREIGN PATENT DOCUMENTS

| | | | |
|---|---|---|---|
| 670785 | 9/1963 | Canada | 75/0.5 BB |
| 4130 | 4/1972 | Japan | 75/0.5 BB |

OTHER PUBLICATIONS

*Metals Handbook*, 9th Edition, v. 2, p. 713, 1979.
May, T. C. et al., "A New Physical Mechanism for Soft Errors in Dynamic Memories", pp. 33–40.

Primary Examiner—L. Dewayne Rutledge
Assistant Examiner—George Wyszomierski
Attorney, Agent, or Firm—Seidel, Gonda, Goldhammer & Abbott

[57] ABSTRACT

There is provided a high-purity molybdenum target or high-purity molybdenum silicide target for LSI electrodes which comprises a high-purity metallic molybdenum having an alkali metal content of not more than 100 ppb and a radioactive element content of not more than 10 ppb. Further, a process is provided for producing such target comprising a wet purification processing followed by a series of dry processings.

12 Claims, 2 Drawing Sheets

HIGH-PURITY METAL AND METAL SILICIDE TARGET FOR LSI ELECTRODES

This application is a division of application Ser. No. 634,895 filed on 7/26/84, now U.S. Pat. No. 4,619,695 issued 10/28/86.

BACKGROUND OF THE INVENTION

This invention relates to a high-purity molybdenum target and a high-purity molybdenum silicide target for use in forming films for electrodes of LSI and also to a process for producing such targets.

The gate electrodes of MOS(metal-oxide semiconductor)LSI have hitherto been made of polycrystalline silicon. However, the recent trend toward higher degrees of integration in the fabrication of the MOSLSI is causing a serious problem of signal delay due to the resistivities of polycrystalline silicon gate electrodes. Meanwhile, in order to facilitate the manufacture of MOS devices by the self-aligning technique, the use of high-melting-point materials is desired for the gate electrodes. Varied attempts have therefore been made to utilize the high-melting-point metals and their silicides of lower resistivities than the polycrystalline silicon in the fabrication of MOS gate electrodes.

For the manufacture of MOS devices the so-called self-aligning method is in use which consists in forming a gate electrode and ionically implanting impurities for doping into the interior of the semiconductor, with the gate electrode itself acting as a mask, so as to define source and drain regions. In that case, a heat treatment at about 1000° C. is required to activate the impurities following the ion implantation. This is the reason why a high melting-point material is to be chosen for forming MOS gate electrodes.

Electrode wiring to be formed on silicon devices must satisfy a number of requirements as follows:
(1) High purity
(2) Low resistivity
(3) Great heat resistance
(4) Good adhesion to the $SiO_2$ film of the substrate
(5) No reaction with, or diffusion in, the $SiO_2$ substrate film
(6) High ability of blocking ion implantation
(7) Ability of making stable contact with silicon However, it is not too much to say that electrode materials that can completely satisfy all these conditions are practically nil.

Therefore, as electrodes that can replace the silicon gate electrodes, that is the electrodes amenable to the self-aligning process, studies on high-melting point metal gate electrodes whose low resistivities are the primary consideration and also studies on silicide electrodes primarily compatible with the silicon gate process have been started. However, the resistivities of silicides are lower than that of polycrystalline silicon by only about one order of magnitude, and their application to MOS memories of 256 kilobits and larger scales is considered questionable.

Among low-resistivity, high-melting-point metals, those which fairly satisfy the aforementioned conditions are molybdenum and tungsten, with melting points above 2000° C. and resistivities below 10 $\mu\Omega$cm. Of the two, molybdenum is capable of forming a high-quality film near a bulk resistivity ($5.7 \times 10^{-6}$ $\Omega$cm). Hence molybdenum is a most promising electrode material for future very-large-scale integrations (VLSI).

Methods of forming molybdenum films are broadly divided into three groups; sputtering, vacuum deposition, and chemical vapor deposition (CVD). Of these, sputtering and vacuum deposition using an electron beam are superior in the quality of resulting film, reproducibility, and adaptability for quantitative production. Sputtering is a technique in which a metal target plate is subjected to argon ion bombardment to release the metal from the surface and released metal is deposited on the substrate disposed opposite to the target plate. Electron-beam vacuum deposition involves the melting of a molybdenum ingot source by an electron beam and effecting the vapor deposition. Thus, the purity of the resulting film is governed by the purity of the target plate or vapor source.

The impurities that influence the MOS device performance are classified into the following three groups:
(1) Alkali metals such as sodium, etc.
(2) Radioactive elements such as uranium, thorium etc.
(3) Heavy metals such as iron etc.

Of these impurities, sodium and other alkali metals move easily through the gate dielectric layer to deteriorate the characteristics of the MOS. Radiation damages by the radioactive elements can fatally affect the operational reliability of the MOS device. Iron and other heavy metals can produce surface states or cause junction leaks. For these reasons, minimizing the contents of these impurities, i.e., alkali metals, radioactive elements, and heavy metals, is a basic requirement for the materials to constitute MOSLSI.

The molybdenum target plates commercially available today are ones formed simply by compacting molybdenum powder, sintering the compact, and then machining the sintered body. The grade being claimed to be the purest is at most 99.9% pure. The purity of the cleanest existing molybdenum vapor source is 99.99%. The materials are usually not analyzed for their sodium and uranium contents. Analyses made by the present inventors have revealed that the commercial target plates contain several parts per million sodium, more than 500 parts per billion uranium, and several ten ppm iron. These contents are greater than in the other MOSLSI constituent materials, such as polycrystalline silicon and $SiO_2$, by at least two orders of magnitude. This obviously indicates that there is no possibility of successfully incorporating molybdenum gate electrodes to MOSLSI and VLSI unless a molybdenum target plate and a molybdenum vapor source are developed which are refined to higher purity levels by at least two orders of magnitude and reduced in their alkali element and radioactive element contents to be generally as pure as the other constituent materials of MOSLSI.

On the other hand, among the silicides as possible electrode materials, molybdenum silicide is being most widely studied. The molybdenum silicide film is often formed by sputtering. In that case, either a molybdenum silicide target is directly employed or a target combining cut pieces of molybdenum and silicon plates in a mosaic pattern is used. Sometimes both molybdenum and silicon targets are provided and they are simultaneously sputtered. So far as silicon is concerned, grades of very high purities already been developed and the purity of the silicide electrode depends solely upon that of the molybdenum used. As stated above, the commercially available clean molybdenum is about 99.9% pure and hence the purity of the resulting molybdenum silicide electrode is at most 99.9%. This has been a major limitation to the use of silicide electrodes for MOSLSI.

Thus, there has been urgent need for developing an exceptionally pure molybdenum sputter source or vapor source material, not less than 99.999% pure with very low alkali element and radioactive element contents to attain favorable performance of the electrode, be it of molybdenum or molybdenum silicide.

SUMMARY OF THE INVENTION

In view of the state of the art, the present inventors have made intensive efforts for the solution of the above problem. They have now successfully established a process whereby a high-purity metallic molybdenum with extremely low levels of alkali element and radioactive element contents can be produced by refining a commercially available metallic molybdenum or molybdenum compound. As a consequence, high-purity molybdenum targets and high-purity molybdenum silicide targets are provided which can exhibit very desirable film characteristics when formed into molybdenum films for LSI electrodes. The term "molybdenum target" as used herein is intended to embrace a molybdenum material in the form of a plate or other shape as a sputter source or vapor source.

DETAILED EXPLANATION

Figure 1:
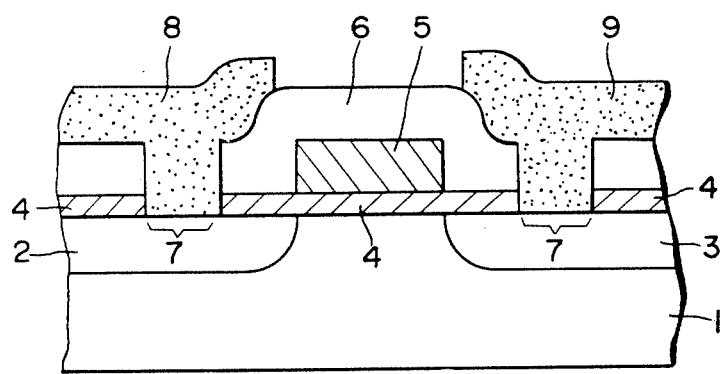
FIG. 1 is an illustration of the structure of principal part of a MOSFET using a molybdenum or molybdenum silicide gate.

The invention will now be described in detail. FIG. 1 shows a MOS field-effect transistor using molybdenum or molybdenum silicide as alternative materials for the gate electrode. The numeral 1 indicates a substrate in which a source region 2 and a drain region 3 are provided. Above the substrate 1 is formed, through a gate oxide film 4, a molybdenum or molybdenum silicide gate electrode 5, which in turn is covered with a dielectric, chemically-vapor-deposited $SiO_2$ 6. The portions of the CVD $SiO_2$ 6 extending away from the both sides of the molybdenum or molybdenum silicide gate electrode 5 and the corresponding portions of the gate oxide film 4 are formed with contact holes 7 through which a source electrode 8 and a drain electrode 9 make contact, respectively, with the source region 2 and the drain region 3. For proper operation of this MOS transistor the molybdenum gate electrode or molybdenum silicide electrode 5 is required, as noted above, to be ultrapure, with the least possible alkali metal, radioactive element, and heavy metal contents. The molybdenum or molybdenum silicide gate electrode is formed by sputtering or vacuum deposition. The molybdenum target as the source should have ultrahigh purity with an alkali metal content of not more than 100 ppb and a radioactive element content of not more than 10 ppb. The molybdenum target may take any of varied forms, e.g., planer, square, or columnar, depending on the device in which it is used.

The process for producing such a high-purity molybdenum target will be described below.

As stated above, the commercially available metallic molybdenum or molybdenum compound contains several ppm of sodium, more than 500 ppb of uranium, and over several ten ppm of heavy metals such as iron. Dry purification, based on heating, gas or vacuum treatment or both, proves effective to some degree and could be used in the manufacture of products for applications where the purity requirements are less severe. However, the applications under the invention call for greater purity of 99.999% or more, with an alkali metal content of less than 100 ppb and radioactive element content of less than 10 ppb. To attain such higher purity, it has been found necessary to introduce a wet purification process which starts with preparation of an aqueous solution of a commercially available metallic molybdenum or molybdenum compound. An intermediate product that is obtained through the wet purification is molybdenum powder of high purity. It must be formed into a high-purity molybdenum target of planer, square, or columnar shape or in the form of a rod, bar, wire, strand, or small piece. Thus, the powder as a starting material is formed into the product of a given shape through a series of dry processing steps. The present inventors have found that an effect of removing impurities, notably elements of high vapor pressures, can be attained and therefore a high-purity molybdenum shape can be produced by further refining the high-purity molybdenum powder that resulted from wet purification by a dry process, especially by electron-beam melting. As the result of studying the conditions of the individual dry processing steps, the processing flow as taught by this invention has now established.

The molybdenum starting material to be employed is, as noted above, a powdered metallic molybdenum or molybdenum compound of commerce. When a molybdenum compound, such as molybdenum oxide or ammonium molybdate, is used, it must be low in alkali metals and radioactive elements. Metallic molybdenum dissolves in acids, and molybdenum oxide in ammonia. Other molybdenum compounds dissolve in aqueous solvents of high solubilities. The acid employable for the above purpose is hydrochloric, nitric, hydrofluoric, or sulfuric acid or a mixture of two or more such acids. Among those acids, nitric acid is preferred in that it can be more easily purified by distillation or other known technique and can readily dissolve molybdenum. Like acids, ammonia is desired to be purified by distillation before use. Purification of an aqueous molybdenum solution is accomplished not only by filtration for removal of solid impurities but, where necessary, by crystallization of molybdic acid or ammonium molybdate followed by redissolution. As a condition for handling the resulting solution, a concentration below saturation should, of course, be chosen in consideration of its solubility. This is particularly important with an aqueous molybdenum solution which sometimes exhibits discontinuity in its solubility curve under certain conditions, of temperature in particular.

After the aqueous solution of high-purity molybdenum has been prepared, its composition is adjusted and the temperature controlled to obtain molybdenum-containing crystals. The crystals are collected by solid-liquid separation, washed, and dried. For this wet process it is necessary that the reaction vessel, filter, and other equipment be chemical-resistant and clean. Service water and chemicals to be used must be of high purities, with particularly low alkali metal and radioactive element contents. The water is preferably of ultrahigh purity. Adequate care should also be exercised in securing satisfactory environments for the purification chamber. If necessary, a clean booth and the like may be installed.

The high-purity molybdenum-containing crystals collected by the above-described wet purification technique are then reduced by heating. The reduction is carried out in the usual manner by the use of high-purity hydrogen. In order to avoid the evaporation of MoO3 it is advisable to adopt a two-stage reduction method which consists of heating at 600°-700° C. at the first stage and at 1000°-1100° C. at the second stage. As in the wet purification the reaction vessel, chemicals, and environments should be kept clean throughout. The reaction vessel is preferably of ceramics because of the resistance to corrosion and heat. Ceramic vessels of alumina, quartz, silicon carbide, and various other oxides, carbides, and nitrides may be used. In any case, care must be taken in choosing a reaction vessel not contaminated with an alkali metal or radioactive element.

Forming the molybdenum-containing crystals as coarse particles by wet purification is desirable because it is convenient for washing. Moreover, the particle size of the molybdenum-containing crystals is correlated with the particle size of the metallic molybdenum powder obtained by reduction, and from the viewpoint of processing too, it is important to produce the molybdenum-containing crystals in the form of coarse particles.

The high-purity metallic molybdenum powder obtained by reducing the molybdenum-containing crystals is most preferably melted and formed into an ingot by electron-beam melting that can be expected to achieve an impurity-eliminating effect too. The powder compact to be electron-beam melted should be free of occluded gas and have no danger of being contaminated in any way, and is also desired to be a long sintered body with a high apparent density. For these reasons it is most desirable that the manufacture of the sintered compact be by the hot isotactic compacting and the forming of the green compact of molybdenum powder to be so pressed be by cold isotactic compacting. Needless to say, care should be used to employ container materials free from contamination in the both operations.

The high-purity metallic molybdenum ingot thus formed is plastically worked to a molybdenum target of a final desired form. While the plastic working may be done by hot forging or rolling, it is better accomplished by hot extrusion or vacuum forging which induces less possibility of contamination. The cutting and surface finish of the molybdenum plate or other shape are performed in the usual manner with care against contamination.

For the manufacture of a molybdenum silicide target, the high-purity molybdenum powder is mixed with a high-purity silicon powder, and the mixture is compacted to a green compact and then sintered.

The high-purity molybdenum target purified and worked in the foregoing manner has extremely low alkali metal and radioactive element contents. The molybdenum electrode film formed from this target is obviously superior in gate performance to those made from conventional targets, as is evident from a reference example to appear later.

An example of the invention and a reference example for the sake of performance evaluation will be given below.

EXAMPLE

A commercially available 99.9%-pure metallic molybdenum powder which contained 9,750 ppb potassium, 1,400 ppb sodium, 710 ppb uranium, 58 ppm iron, and other metal impurities as on the first line of Table 1 was processed by dissolution in nitric acid, purification of the aqueous solution, collection of molybdic acid crystals, and two-step hydrogen reduction to prepare a high-purity metallic molybdenum powder.

This high-purity metallic molybdenum was sintered through cold isotactic compacting and hot isotactic compacting, and the sintered compact was electron-beam melted to a high-purity molybdenum ingot. This ingot was hot extruded and machined to a disk-shaped high-purity molybdenum target of 12 mm thickness and 254 mm diameter, weighing 6.3 kg. With a purity over 99.999%, it contained less than 30 ppb potassium, less than 10 ppb sodium, 1 ppb uranium, 0.5 ppm iron, and other metal impurities as shown on the last line of Table 1. The table gives impurity analyses of a commercially available metallic molybdenum used as the starting material in this example; a high-purity metallic molybdenum obtained by wet purification of the starting material; and a high-purity molybdenum target produced by further dry purification of the above metal powder.

TABLE 1

| Impurity content | Weight ppb | | | Weight ppm | | | | | | | | | |
|---|---|---|---|---|---|---|---|---|---|---|---|---|---|
| | K | Na | U | Fe | Ni | Co | Cr | Mn | V | Cu | Zn | Al | Zr |
| Starting material Mo powder | 9750 | 1400 | 710 | 58 | 3 | <0.01 | 32 | 3 | 3 | 15 | 1 | >1 | 0.1 |
| High-purity Mo powder | 670 | 35 | 3 | 4 | 0.4 | <0.01 | 4 | 0.5 | 0.2 | 5 | 0.4 | 1 | 0.07 |
| High-purity Mo target | <30 | <10 | 1 | 0.5 | <0.05 | <0.01 | <0.01 | 0.2 | <0.01 | 0.1 | 0.05 | <0.03 | <0.06 |

For the analyses, the Fe through Zr contents were determined by spark source mass spectrometry (SSMS), the K and Na contents by flameless atomic absorption, and the U content by fluorophotometry.

REFERENCE EXAMPLE

A gate oxide film was formed to a thickness of 200 Å on a silicon substrate. Further, on this film, a 3000 Å-thick molybdenum film was deposited using high-purity molybdenum target obtained in the above example of the invention. A similar film was also deposited using conventional molybdenum target. These molybdenum films were analyzed to determine their uranium and sodium contents. Also, the films were processed by ordinary lithography and etching to form molybdenum electrodes on MOS diodes, and the diodes were subjected to movable-ion tests. The results were as follows.

1. Analyses of impurities in molybdenum films
   (1) Uranium contents*
       Product of this invention: under 1 ppb Conventional product: 300 ppb
° Analyzed by fluorophotometry.

(2) Sodium contents

Figure 2:
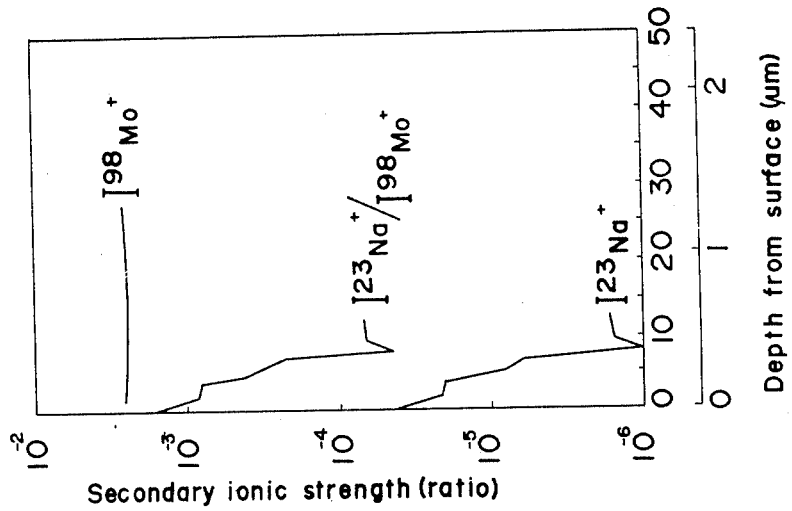
FIGS. 2(a) and (b) are graphs showing the results of SIMS analyses on sodium contents in molybdenum films.
Figure 2:
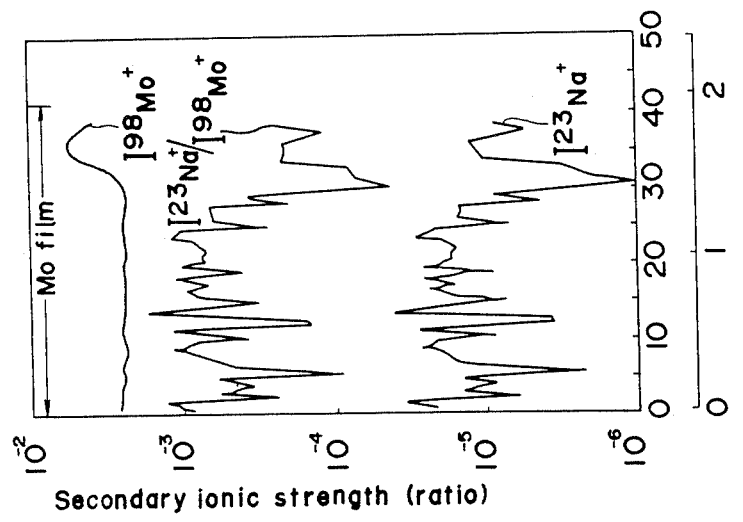

Analyses by secondary-ion mass spectrometry (SIMS) were made. The results are summarized in graphs of secondary ionic strength ratios with Na in FIG. 2. Graph (a) represents the results with the conventional product, and graph (b) the results with the product of the present invention. The latter clearly shows that the contamination inside the film according to the invention is very slight.

2. Mobile charges evaluation with molybdenum-gate MOS diodes

Following the formation of molybdenum gates, MOS diodes were not heat-treated (Example 1) or heat-treated in a nitrogen atmosphere at 1000° C. (Example 2). The products were tested by the triangular voltage sweep method (TVS). The results are tabulated below.

|  | Example 1 | Example 2 |
|---|---|---|
| This invention | undetected | undetected |
| Conventional | $2.3 \times 10^{10}$ cm$^{-2}$ | $5.3 \times 10^{10}$ cm$^{-2}$ |

(detectable limit: $3 \times 10^9$ cm$^{-2}$)

It is obvious that, when a high-purity molybdenum obtained in conformity with the invention is used as a target for forming a molybdenum silicide film, the result will be practically as favorable as that already stated in the reference example.

The molybdenum silicide film is formed in one of three ways; from a molybdenum silicide target made by sintering a mixture of high-purity molybdenum particles and high-purity silicon particles; by the sputtering technique using a mosaic target which combines high-purity molybdenum and high-purity silicon plates; or by simultaneous sputtering of a high-purity molybdenum target and high-purity silicon target. As is well known, silicon having 9-nine or higher purity with low radioactive element and alkali metal contents is available with ease. It will be readily understood, therefore, that combining the high-purity silicon of commerce with the high-purity molybdenum according to the invention will give a more than 99.999%-pure molybdenum silicide target and hence will yield a high-purity molybdenum silicide film with most excellent performance.

As has been described above, the molybdenum target and molybdenum silicide target of this invention are purer than conventional products by more than two nines. This means that the present invention opens up an avenue for the practical manufacture of molybdenum and molybdenum silicide electrodes which has been deemed necessary and yet has hitherto been hampered by inadequate purities of the available targets.

Part of the process according to the present invention is applicable to the manufacture of targets for LSI electrodes of high-melting metals other than molybdenum, e.g., of tungsten, titanium, niobium, and tantalum. In particular, the compacting and sintering of the high-purity metal powder and subsequent processing steps may be common to the processing of the above-mentioned high-melting metals. It is expected that, in conformity with the present process, an effect of removing impurities, mainly the elements with high vapor pressures, can be achieved during melting and ingot forming electron-beam melting.

What is claimed is:

1. In a sputtering or vapor-deposition arrangement for the formation of LSI electrodes wherein a high-purity metal target is used as a source of metal vapor for said arrangement so that a film of said metal is formed on a substrate, the improvement comprises said metal of the target being selected from a group consisting of molybdenum, tungsten or compounds thereof, said metal having an alkali metal content of not more than about 100 ppb and a radioactive element content of not more than about 10 ppb.

2. The arrangement of claim 1 wherein the high-purity metal target has been produced by dissolving the metal into an acid or ammonia to form an aqueous metal-containing solution; filtering the aqueous solution; causing the aqueous metal-containing solution to form metal-containing crystals by adjusting temperature and composition of the solution; collecting the crystals by solid-liquid separation; washing and drying the collected crystals; reducing the dried crystals by heating in the presence of high-purity hydrogen to produce a high-purity metal powder; compacting the powder; sintering the compact; electron beam melting the sintered compact to produce a high-purity metal ingot; and thereafter plastically working the ingot with subsequent machining.

3. The arrangement of claims 1 or 2 wherein the alkali metal is selected from a group consisting of sodium, potassium or the combination thereof.

4. The arrangement of claims 1 or 2 wherein the radioactive element is selected from a group consisting of uranium, thorium or a combination thereof.

5. The arrangement of claims 1 or 2 wherein the high-purity metal target has an iron content of about 0.5 ppm, a nickel content of less than about 0.05 ppm, and a cobalt content of less than about 0.01 ppm.

6. A metal electrode film deposited on a substrate made according to the arrangement of claims 1 or 2.

7. In a sputtering or vapor-deposition arrangement for the formation of LSI electrodes wherein a high-purity metal silicide target is used as a source of metal vapor for said arrangement so that a film of said metal is formed on a substrate, the improvement comprises said metal of said metal silicide of the target being selected from a group consisting of molybdenum, tungsten or compounds thereof, said metal silicide having an alkali metal content of not more than about 100 ppb and a radioactive element content of not more than about 10 ppb.

8. The arrangement of claim 7 wherein the high-purity metal silicide target has been produced by mixing a high-purity molybdenum or tungsten metal powder with a high-purity silicone powder; said molybdenum or tungsten metal powder being prepared by dissolving the metal into an acid or ammonia to form an aqueous metal-containing solution; filtering the aqueous solution; causing the aqueous metal-containing solution to form metal-containing crystals by adjusting temperature and composition of the solution; collecting the crystals by solid-liquid separation; washing and drying the collected crystals; reducing the dried crystals by heating in the presence of high-purity hydrogen to form a high-purity metal powder; compacting the mixture of powders; sintering the compact; and thereafter plastically working the sintered compact with subsequent machining.

9. The arrangement of claims 7 or 8 wherein the alkali metal is selected from a group consisting of sodium, potassium or a combination thereof.

10. The arrangement of claims 7 or 8 wherein the radioactive element is selected from a group consisting of uranium, thorium or a combination thereof.

11. The arrangement of claims 7 or 8 wherein said high-purity metal silicide target has an iron content of about 0.5 ppm, a nickel content of less than about 0.05 ppm, and a cobalt content of less than about 0.01 ppm.

12. The metal silicide electrode film deposited on a substrate made according to the arrangement of claims 7 or 8.

* * * * *